US 6,451,677 B1

(12) United States Patent
Lu et al.

(10) Patent No.: US 6,451,677 B1
(45) Date of Patent: Sep. 17, 2002

(54) PLASMA-ENHANCED CHEMICAL VAPOR DEPOSITION OF A NUCLEATION LAYER IN A TUNGSTEN METALLIZATION PROCESS

(75) Inventors: Jiong-Ping Lu, Dallas, TX (US); Boyang Lin, Richardson, TX (US); Wei-Yung Hsu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/255,489

(22) Filed: Feb. 23, 1999

Related U.S. Application Data

(60) Provisional application No. 60/075,571, filed on Feb. 23, 1998.

(51) Int. Cl.$^7$ ................. H01L 21/3205; H01L 21/4763; H01L 21/44
(52) U.S. Cl. ............... 438/585; 438/637; 438/641; 438/674; 438/675
(58) Field of Search ................. 438/641, 637, 438/675, 674, 585

(56) References Cited

U.S. PATENT DOCUMENTS

| | | | |
|---|---|---|---|
| 5,028,565 A | * 7/1991 | Chang et al. | 437/192 |
| 5,231,056 A | * 7/1993 | Sandhu | 437/200 |
| 5,250,467 A | * 10/1993 | Somekh et al. | 437/192 |
| 5,286,675 A | * 2/1994 | Chen et al. | 437/195 |
| 5,444,018 A | * 8/1995 | Yost et al. | 437/100 |
| 5,604,158 A | * 2/1997 | Cadien et al. | 437/200 |
| 5,633,199 A | * 5/1997 | Fiordalice et al. | 438/642 |
| 5,665,624 A | * 9/1997 | Hong | 438/244 |
| 6,001,420 A | * 12/1999 | Mosely et al. | 427/258 |

OTHER PUBLICATIONS

Hedge, Rama I, Tobin, Philip J, Sitaram, A. R., Klein, Jeff; Thin Film Properties of Tungsten Nucleation layer in Blanket Tungsten deposition; *J. Electrochem. Soc.*, vol. 144, No. 3, Mar. 1997, pp. 1087–1090.

* cited by examiner

*Primary Examiner*—Olik Chaudhuri
*Assistant Examiner*—Shrininas H Rao
(74) *Attorney, Agent, or Firm*—W. James Brady; Frederick J. Telecky, Jr.

(57) ABSTRACT

An embodiment of the instant invention is a method of fabricating an electronic device formed over a semiconductor substrate and having a conductive feature comprised of tungsten, the method comprising the steps of: forming a nucleation layer over the semiconductor substrate by introducing a combination of $WF_6$, $H_2$ and a plasma; and forming a tungsten layer on the nucleation layer by means of chemical vapor deposition. In an alternative embodiment, an insulating layer is formed on the substrate and situated between the nucleation layer and the substrate. Preferably, this embodiment additionally includes the step of forming a nitrogen-containing layer under the nucleation layer by introducing a combination of $WF_6$, $N_2$, $H_2$, and a plasma. The conductive feature is, preferably, a conductive gate structure, and the insulating layer is, preferably, comprised of: an oxide, a nitride, an insulating material with a dielectric constant substantially higher than that of an oxide, and any combination thereof.

15 Claims, 2 Drawing Sheets

PLASMA-ENHANCED CHEMICAL VAPOR DEPOSITION OF A NUCLEATION LAYER IN A TUNGSTEN METALLIZATION PROCESS

This application claims the benefit of Provisional application Ser. No. 60/075,571, filed Feb. 23, 1998.

CROSS-REFERENCE TO RELATED PATENT/PATENT APPLICATIONS

The following commonly assigned patent/patent applications are hereby incorporated herein by reference:

| Patent No./Ser. No. | Filing Date | TI Case No. |
| --- | --- | --- |
| 08/958,578 | 10/08/1997 | TI-23414 |

FIELD OF THE INVENTION

The instant invention pertains to semiconductor device fabrication and processing and more specifically to a method of fabricating a tungsten layer.

BACKGROUND OF THE INVENTION

In sub-quarter-micron ultra-large scale integrated circuits (ULSIs), a low-resistivity gate electrode is required to reduce limitations on the speed of MOS devices due to the gate RC delay time. Tungsten-polycrystalline silicon gate structures have lower sheet resistance than conventional poly or policide gates. Because tungsten reacts with silicon at temperature as low as 600° C., it is critical to have a high quality diffusion barrier between tungsten and silicon. $WN_x$ and TiN are candidates as the diffusion barriers between tungsten and polycrystalline silicon to avoid silicidation of the tungsten film. Structures using $WN_x$ have the advantage of using selective oxidation to repair etch damage to the gate oxide.

Thermal chemical vapor deposition (CVD) of tungsten is an important process for depositing tungsten films used as conductors in integrated circuit devices. This step is, typically, performed as:

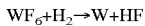

$WF_6 + H_2 \rightarrow W + HF$

However, this process needs to have a nucleation layer in order to have adequate deposition rate and uniformity. Conventionally, a $SiH_4 + WF_6$ step is used for depositing a nucleation layer for subsequent thermal CVD-tungsten formation. However, for thin tungsten layers, e.g. less than 100 nanometers thick, such as in tungsten-polycrystalline silicon gate stacks, the incorporation of silicon in the nucleation layer causes higher sheet resistance. This becomes particularly undesirable for future devices because the trend for future devices is to have gates with smaller gate lengths and lower resistivity.

Because the $SiH_4 + WF_6$ step is thermally driven, the nucleation property is substrate dependent. This results in rough surface morphology on certain substrates, such as $WN_x$. Rough surface morphology is not desirable because it will affect the subsequent patterning steps required for fabricating gate structures.

SUMMARY OF THE INVENTION

One embodiment of the instant invention utilizes a plasma enhanced chemical vapor deposition (PECVD) tungsten step to replace the silane-initiated nucleation step in prior methods. The method of the instant invention can be used to form a conductive gate structure which is comprised of tungsten or a tungsten/polycrystalline silicon (herein referred to as poly or polysilicon) stack, a via or interconnect which is comprised of tungsten, or any other conductive structure which is comprised of tungsten. One embodiment of the instant invention is a process used to form tungsten-poly stacks which is comprised of the following steps: (1) deposition of a layer of poly or amorphous silicon on gate dielectric-covered substrate; (2) deposition of a thin layer of $WN_x$; (3) deposition of a thin layer of PECVD tungsten and (4) deposition of thermal CVD tungsten.

An advantage of the invention is that the nucleation layer can be deposited on a wide range of substrates due to the PECVD advantage. Another advantage of the invention is that incorporation of Si into the nucleation layer is eliminated. This improves the sheet resistance of the tungsten layer, particularly when the tungsten layer is thin. Another advantage of the invention is the low equipment cost. WNx, PECVD tungsten and thermal CVD tungsten can all be performed using the same chamber. In addition, CVD tungsten chambers are already widely available in semiconductor fabs worldwide. Another advantage of the instant invention is that high throughput can be achieved for low resistance wordline stack fabrication. Both the barrier and the tungsten structure can be performed in the same chamber using one single sequence and therefore the process overhead is greatly reduced. Another advantage of the invention is that the gate structures thus formed can use selective oxidation for removing etching damage to gate oxide.

An embodiment of the instant invention is a method of fabricating an electronic device formed over a semiconductor substrate and having a conductive feature comprised of tungsten, the method comprising the steps of: forming a nucleation layer over the semiconductor substrate by introducing a combination of $WF_6$, $H_2$ and a plasma; and forming a tungsten layer on the nucleation layer by means of chemical vapor deposition. In an alternative embodiment, an insulating layer is formed on the substrate and situated between the nucleation layer and the substrate. Preferably, this embodiment additionally includes the step of forming a nitrogen-containing layer under the nucleation layer by introducing a combination of $WF_6$, $N_2$, $H_2$, and a plasma. The conductive feature is, preferably, a conductive gate structure, and the insulating layer is, preferably, comprised of: an oxide, a nitride, an insulating material with a dielectric constant substantially higher than that of an oxide, and any combination thereof.

In another alternative embodiment, the nucleation layer is formed over a conductive gate structure which is insulatively disposed over the semiconductor substrate. Preferably, this embodiment also includes the step of forming a nitrogen-containing layer under the nucleation layer by introducing a combination of $WF_6$, $N_2$, $H_2$, and a plasma.

In another alternative embodiment, a dielectric layer is formed between the nucleation layer and the semiconductor substrate, the dielectric layer having openings which has sides extending from the top of the dielectric layer to the bottom of the dielectric layer, and the nucleation layer is situated on top of the dielectric layer and on the sides of the openings of the dielectric layer. Preferably, this embodiment additionally includes the step of forming a nitrogen-containing layer between the nucleation layer and the dielectric layer by introducing a combination of $WF_6$, $N_2$, $H_2$, and a plasma. The dielectric layer is, preferably, comprised of: HSQ, BPSG, PSG, aerogel, xerogel, an oxide, a nitride, and any combination thereof.

Another embodiment of the instant invention is a method of fabricating a chemical-vapor deposited tungsten-containing layer over a semiconductor substrate, the method comprising the steps of: forming a nitrogen-containing layer over the semiconductor substrate by introducing a combination of WF$_6$, a nitrogen-containing gas, H$_2$, and a plasma; and forming a nucleation layer on the nitrogen-containing layer by introducing a combination of WF6, H$_2$ and a plasma. Preferably, the temperature of the semiconductor substrate is around 400 to 500 C.

DETAILED DESCRIPTION OF THE DRAWINGS

In essence, the instant invention is a novel method of forming a nucleation layer for a deposited metal. Preferably, the nucleation layer is comprised of PECVD tungsten and the deposited layer is comprised of CVD tungsten. More specifically, the nucleation layer is preferably provided by the following reaction which is performed with the assistance of a plasma (i.e. PECVD):

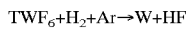
TWF$_6$+H$_2$+Ar→W+HF

Preferably, this is accomplished using the following conditions (however, one of ordinary skill in the art will be able to adjust these conditions so as to better form these layers in different environments):

| WF$_6$ flow: | 3–10 sccm |
|---|---|
| H$_2$ flow: | 100–1000 sccm |
| Ar flow: | 300–1000 sccm |
| Susceptor temp: | 400–500 C. |
| Reactor pressure: | 3–5 Torr |
| Plasma power: | 200–500 W |
| Deposition time: | 10–20 seconds |

The subsequent deposition is preferably accomplished by thermal chemical vapor deposition with the following reaction:

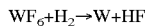
WF$_6$+H$_2$→W+HF

Additionally, the instant invention can be used to form a nucleation layer that is comprised of any material that is known to have similar properties as tungsten. In addition, the overlying conductive structure can be comprised of almost any conductor. The following descriptions are provided to give a couple of examples as to structures that can be formed using the methodology of the instant invention.

Figure 1A:
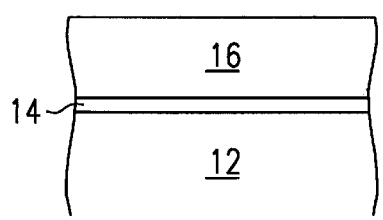
FIGS. 1a–1d are cross-sectional views of a partially-fabricated device fabricated using the methodology of one embodiment of the instant invention.

Referring to the embodiment of FIG. 1a–1d, substrate 12 is provided in FIG. 1a. Substrate 12 is preferably comprised of single-crystal silicon, epitaxial silicon formed on single-crystal silicon, or polycrystalline silicon formed on single crystal silicon. Insulating layer 14 is formed on substrate 12. Preferably, insulating layer is on the order of 1–10 nanometers thick and is comprised of an oxide (such as SiO$_2$), a nitride (such as SiN$_x$), a combination of the two, or other gate dielectric material such as Ta$_2$O$_5$ or TiO$_2$. Semiconductor layer 16 is formed over insulating layer 14. Preferably, semiconductor layer 16 is comprised of doped polycrystalline silicon, but it could also be comprised of undoped polycrystalline silicon, tungsten, or silicided polycrystalline silicon.

Figure 1B:
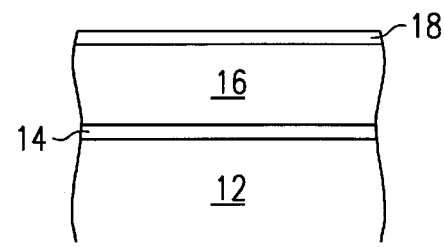

Referring to FIG. 1b, protecting layer 18 is formed next, but this step is optional. Hence, layer 18 may be omitted and then layer 20 would be formed directly on layer 16. If it is formed, layer 18 is preferably comprised of oxide (such as SiO$_2$), a nitride (such as SiN$_x$), or a combination of the two. In one embodiment, layer 18 is comprised of a nitride which is formed using either an N$_2$/H$_2$ plasma, NH plasma, rapid thermal nitridation or by subjecting the wafer to a nitrogen-containing ambient. If a N$_2$/H$_2$ plasma is utilized, the processing conditions would preferably be: plasma power around 200–500 W; reaction pressure around 0.1–5 Torr, flow rate around 100–1000 sccm for both N$_2$ and H$_2$, and a susceptor temperature around 400–500 C. Preferably, layer 18 is around 1 to 3 nanometers thick.

Figure 1C:
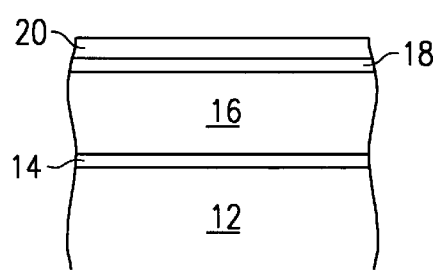

Referring to FIG. 1c, layer 20 is formed on layer 18 (if it is formed) or directly on layer 16. Layer 20 is comprised of the nucleation layer of the instant invention, and it may additionally be comprised of an underlying nitride layer. If nucleation layer portion of layer 20 is comprised of tungsten, then the underlying nitride portion would preferably be comprised of tungsten nitride (more preferably a PECVD tungsten nitride layer). Preferably, this tungsten nitride layer is formed using the following reaction

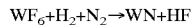
WF$_6$+H$_2$+N$_2$→WN+HF with the following processing conditions:

| WF$_6$ flow rate | 3–10 sccm |
|---|---|
| N$_2$ flow rate | 50–200 sccm |
| H$_2$ flow rate | 100–1000 sccm |
| Ar flow rate | 300–1000 sccm |
| Susceptor Temp. | 400–500 C. |
| Reactor Pressure | 3–5 Torr |
| Plasma Power | 200–500 W |
| Deposition Time 5–15 sec | |

To form the nucleation layer of the instant invention, the N$_2$ flow can be discontinued and additional argon can be flowed in its place.

Figure 1D:
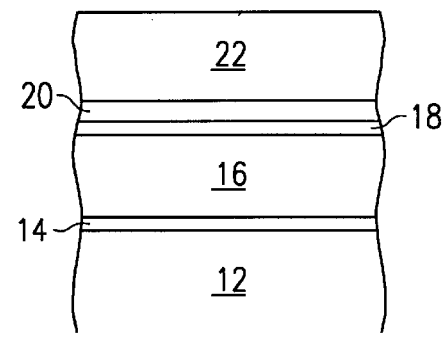

Referring to FIG. 1d, conductor 22 is formed on nucleation layer 20. Preferably, conductor 22 is comprised of CVD tungsten, but conductor 22 could be comprised of any conductive material. This is preferably accomplished at around 400 to 550 C. (more preferably around 475 C.) using the following reaction:

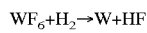
WF$_6$+H$_2$→W+HF

Figure 2A:
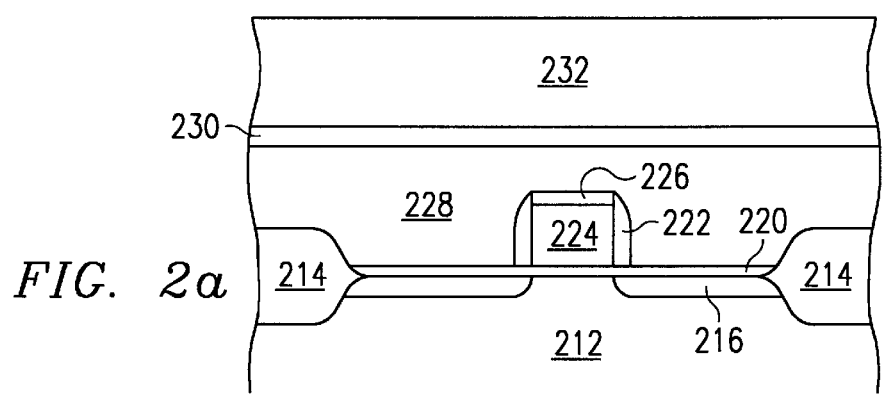
FIGS. 2a–2e are cross-sectional views of a partially-fabricated device fabricated using the methodology of another embodiment of the instant invention.

In an alternative embodiment, a contact/via/interconnect is formed using the method of the instant invention. Referring to FIG. 2a, a transistor comprised of source/drain regions 216, insulating layer 220, sidewall insulators 222, conductive gate structure 224 and gate insulator 226 is formed over substrate 212. Substrate 212 may be comprised of single crystal silicon or it may be comprised of an epitaxial silicon layer formed over a single crystal silicon substrate. Isolation regions 214 may be formed as conventional field oxidation regions, shallow trench isolation regions, or any other isolation type regions. Preferably, insulating layer 222, insulating cap 226, and sidewall insulators 222 are comprised of an oxide, a nitride, or a combination thereof, but these regions do not have to be comprised of the same materials. Insulating layer 228 is preferably comprised of BPSG, PSG, an oxide, a nitride, or a low dielectric constant material (such are aerogel, xerogel, or HSQ). Insulation layer 230 is optionally formed over insulating layer 228, and is preferably comprised of an oxide, a nitride, or an combination thereof. Insulating layer 232 is preferably comprised of BPSG, PSG, an oxide, a nitride, or a low dielectric constant material (such are aerogel, xerogel, or HSQ).

Figure 2B:
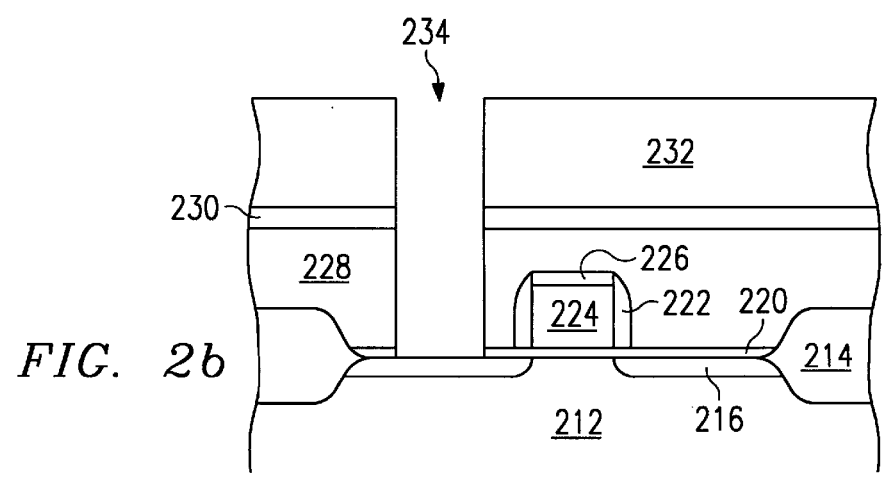

Referring to FIG. 2b, opening 234 is formed through insulating layer 228, 230 and 220. Preferably, this is accomplished in a minimum number of steps. The sidewalls of opening 234 are preferably close to being substantially vertical. In addition, the surface of substrate 212 in source/drain region 216 is preferably cleared of substantially all material at the bottom of opening 234. It is important that the surface of region 216 which is exposed by opening 234 is substantially free from any insulating material so that the contact formed using the instant invention can make a clean contact to region 216. Please note, that while FIG. 2 illustrates a contact formed using the method of the instant invention, any type of contact, interconnect, or via can be formed using the method of the instant invention.

Figure 2C:
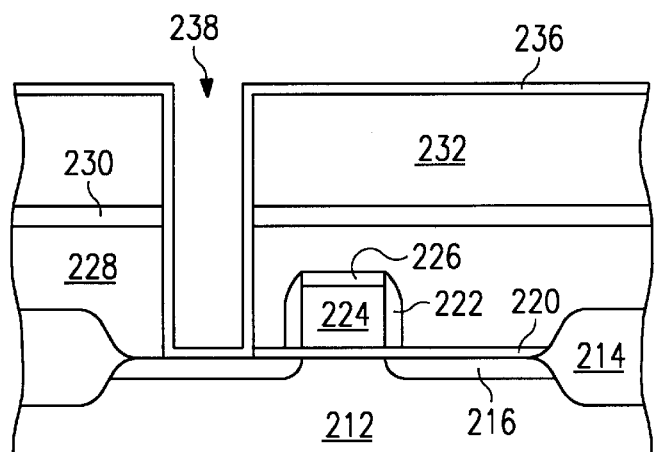

Referring to FIG. 2c, layer 236 is (optionally) formed on layer 232 and on the surfaces exposed by opening 234 (FIG. 2b). Preferably, layer 236 is comprised of a conductive material that is not easily oxidized and will additionally act as a barrier so that the structures under layer 236 will not contaminate or be contaminated by overlying conductors. In light of this, layer 236 is preferably comprised of a Ti/TiN stack. However, other materials with similar properties can be used.

Figure 2D:
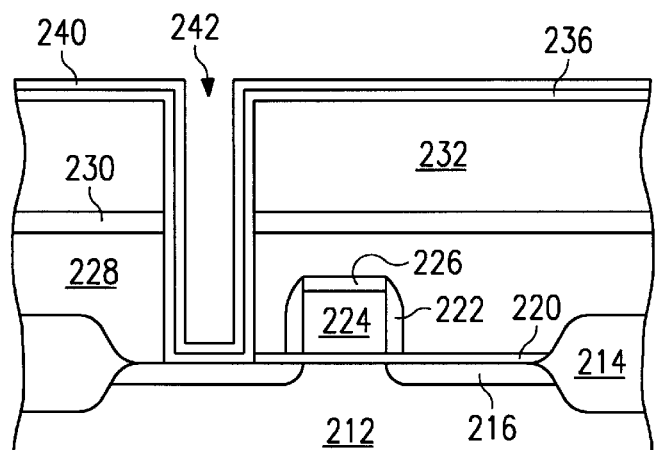

Referring to FIG. 2d, nucleation layer 240 is formed on layer 236. Nucleation layer 240 may be additionally comprised of an underlying nitride layer as is described above with reference to FIG. 1c. Nucleation layer 240 is preferably formed using the method of the instant invention as is described with reference to FIG. 1c or as is described at the beginning of this section. If the underlying nitride layer is desired, the initial gas flow will include $WF_6$, $H_2$, and $N_2$ and the $N_2$ will be turned off and Ar will be used in its place to achieve the nucleation layer of the instant invention.

Figure 2E:
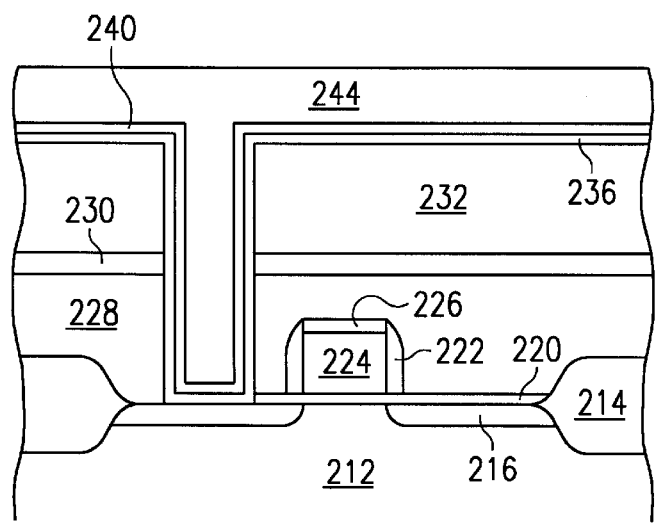

Referring to FIG. 2e, conductor 244 is formed over nucleation layer 240. Preferably, conductor 244 is comprised of CVD tungsten, but any conductive material can be used. Standard processing conditions can be used to form the CVD tungsten. Standard processing can be utilized so as to complete the device fabrication. These devices can be used in memory devices (such as DRAMs, SRAMs, SDRAMs, or any other type of memory device), logic device, DSPs, or microprocessors.

Figure 3A:
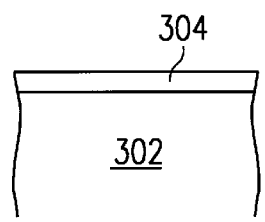
FIGS. 3a–3d are cross-sectional views of a partially-fabricated device fabricated using the methodology of another embodiment of the instant invention.

In yet another alternative embodiment, the method of the instant invention can be used to fabricate a metal gate structure. Referring to FIG. 3a, insulating layer 304 is formed over substrate 302. Preferably, substrate 302 is comprised of single-crystal silicon or epitaxial silicon formed on single-crystal silicon. Insulating layer 304 is preferably comprised of an oxide (such as silicon dioxide or tantalum pentoxide), a nitride, an oxide/nitride stack, or any higher dielectric constant material (such as BST or PZT).

Figure 3B:
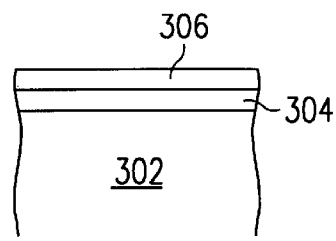

Referring to FIG. 3b, nucleation layer 306 is formed on insulating layer 304. Nucleation layer 306 may be additionally comprised of an underlying nitride layer as is described above with reference to FIG. 1c. Nucleation layer 304 is preferably formed using the method of the instant invention as is described with reference to FIG. 1c or as is described at the beginning of this section. If the underlying nitride layer is desired, the initial gas flow will include $WF_6$, $H_2$, and $N_2$ and the $N_2$ will be turned off and Ar will be used in its place to achieve the nucleation layer of the instant invention.

Figure 3C:
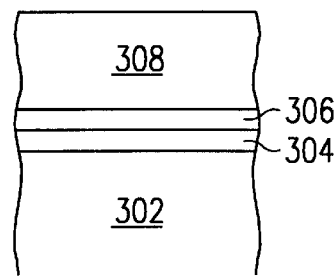

Referring to FIG. 3c, conductor 308 is formed on nucleation layer 306. Preferably, conductor 308 is comprised of CVD tungsten, which can be formed using any conventional technique. However, any conductive material can be used to form conductor 308.

Figure 3D:
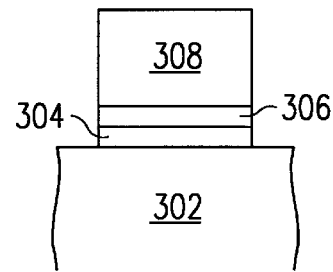

Referring to FIG. 3d, conductor 308 and nucleation layer 306 are patterned and etched (using conventional techniques) so as to form the conductive gate structure. Insulating layer 304 may also be etched or it may remain intact.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating an electronic device formed over a surface of a semiconductor substrate and having a conductive gate feature comprised of tungsten, said method comprising the steps of:

forming an insulating layer having a thickness of about 10 nm or less at the surface;

then depositing a nucleation layer at the surface by plasma-enhanced chemical vapor deposition, at a susceptor temperature of about 500 ° C. or less, using a plurality of gases consisting essentially of a tungsten-bearing gas, hydrogen, and an inert gas; and then depositing a tungsten layer on said nucleation layer by thermal chemical vapor deposition.

2. The method of claim 1, further comprising the step of:

after the step of forming an insulating layer and prior to the step of depositing a nucleation layer, depositing a nitride-containing layer at the surface by plasma-enhanced chemical vapor deposition of a plurality of gases including a tungsten-bearing gas and a nitrogen-bearing gas.

3. The method of claim 1, wherein said conductive feature is a conductive gate structure, 4. The method of claim 1, wherein said insulating layer is comprised of a substance selected from the group consisting of: and oxide, a nitride, an insulating material with a dielectric constant substantially higher than that of a oxide, and any combination thereof.

5. The method of claim 1, further comprising:

prior to the step of depositing the nucleation layer, forming a conductive gate layer over the insulating layer.

6. The method of claim 5, further comprising the step of:

prior to the step of depositing a nucleation layer, depositing a nitride-containing layer over the conductive gate layer, by plasma-enhanced chemical vapor deposition of a plurality of gases including a tungsten-bearing gas and a nitrogen-bearing gas.

7. A method of fabricating an electronic device formed over a surface of a semiconductor substrate and having a conductive feature comprised of tungsten, comprising the steps of:

forming an insulating layer, consisting essentially of BPSG, PSG, an oxide, a nitride, a low dielectric constant material, or any combination thereof, over the substrate;

forming opening through the insulating layer at selected contact locations, the openings having sides extending from the top of said dielectric layer to the bottom of said dielectric layer;

depositing a nucleation layer on top of said dielectric layer and on said sides of said openings of said dielectric layer, by plasma-enhanced chemical vapor deposition, at a susceptor temperature of about 500 °°C. or less, using a plurality of gases consisting essentially of a tungsten-bearing gas, hydrogen, and an inert gas;

then depositing a tungsten layer on said nucleation layer by thermal chemical vapor deposition.

8. The method of claim 7, further comprising the step of:

prior to the step of depositing a nucleation layer, depositing a nitride-containing layer at the surface by plasma-enhanced chemical vapor deposition of a plurality of gases including a tungsten-bearing gas and a nitrogen-bearing gas.

9. The method of claim 7, wherein said insulating layer is comprised of a substance selected from the group consisting of: HSQ, BPSG, PSG, aerogel, xerogel, an oxide, a nitride, and any combination thereof.

10. A method of fabricating a chemical-vapor deposited tungsten-containing layer over a semiconductor substrate, said method comprising the steps of:

forming an insulating layer having a thickness of about 10 nm or less at the surface;

then depositing a nitrogen-containing layer over said semiconductor substrate by plasma-enhanced chemical vapor deposition of a plurality of gases comprising $WF_6$, a nitrogen-containing gas, and $H_2$; and depositing a nucleation layer on said nitrogen-containing layer by plasma-enhanced chemical vapor deposition in a plasma chamber, at a susceptor temperature of about 500 ° C. or less using a plurality of gases consisting essentially of $WF_6$, $H_2$, and an inert gas.

11. The method of claim 10, wherein the step of depositing a nucleation layer is performed in a plasma chamber, at a susceptor temperature of about 400 ° to 500 ° C.

12. The method claim 2, wherein the steps of depositing a nitride-containing layer and depositing a nucleation layer are performed in a plasma chamber receiving flows of the tungsten-bearing gas and the nitrogen-bearing gas;

and further comprising:

after the step of depositing a nitride-containing layer, discontinuing the flow of nitrogen-bearing gas to the plasma chamber;

wherein the step of depositing the nitride-containing layer is performed by continuing the plasma-enhanced chemical vapor deposition, from the step of depositing a nitride-containing layer, in the absence of the nitrogen-bearing gas.

13. The method of claim 6, wherein the conductive gate layer comprises polysilicon.

14. The method of claim 10, wherein the depositing steps are performed in a plasma chamber coupled to receive flows of the plurality of gases;

and further comprising:

after the step of depositing a nitrogen-containing layer, discontinuing the flow of the nitrogen-containing gas, so that the step of depositing a nucleation layer on said nitrogen-containing layer is performed by continuing the plasma-enhanced chemical vapor deposition in the absence of the nitrogen-containing gas.

15. The method of claim 10, further comprising:

depositing a tungsten-containing layer over the nucleation layer by thermal chemical vapor deposition of a plurality of a gases comprising $WF_6$.

* * * * *